(12) United States Patent
Xia et al.

(10) Patent No.: US 12,132,058 B2
(45) Date of Patent: *Oct. 29, 2024

(54) METHOD FOR MANUFACTURING DATA LINE, METHOD FOR MANUFACTURING ARRAY SUBSTRATE AND DISPLAY DEVICE

(71) Applicants: Beihai HKC Optoelectronics Technology Co., Ltd., Beihai (CN); HKC Corporation Limited, Shenzhen (CN)

(72) Inventors: Yuming Xia, Shenzhen (CN); En-Tsung Cho, Shenzhen (CN); Lidan Ye, Shenzhen (CN)

(73) Assignees: BEIHAI HKC OPTOELECTRONICS TECHNOLOGY CO., LTD., Beihai (CN); HKC CORPORATION LIMITED, Guangdong (CN)

( * ) Notice: Subject to any disclaimer, the term of this patent is extended or adjusted under 35 U.S.C. 154(b) by 517 days.

This patent is subject to a terminal disclaimer.

(21) Appl. No.: 17/383,800

(22) Filed: Jul. 23, 2021

(65) Prior Publication Data
US 2022/0028905 A1    Jan. 27, 2022

(30) Foreign Application Priority Data

Jul. 27, 2020 (CN) .......................... 202010733058.2

(51) Int. Cl.
*H01L 21/288* (2006.01)
*H01L 27/12* (2006.01)

(52) U.S. Cl.
CPC ........ *H01L 27/1292* (2013.01); *H01L 27/124* (2013.01); *H01L 27/1259* (2013.01); *H01L 21/2885* (2013.01)

(58) Field of Classification Search
CPC ............ H01L 27/1292; H01L 27/1259; H01L 21/2885
(Continued)

(56) References Cited

U.S. PATENT DOCUMENTS

| 2008/0092947 | A1* | 4/2008 | Lopatin | ............. | H01L 31/02245 |
| | | | | | 136/255 |
| 2015/0279873 | A1* | 10/2015 | Xu | ....................... | H01L 27/1225 |
| | | | | | 438/158 |
| 2017/0110323 | A1* | 4/2017 | An | ......................... | H01L 21/283 |

FOREIGN PATENT DOCUMENTS

| CN | 101553933 A | 10/2009 |
| CN | 102263060 A | 11/2011 |

(Continued)

OTHER PUBLICATIONS

Machine English Translation of CN 102263060. (Year: 2011).*

*Primary Examiner* — Dzung Tran
(74) *Attorney, Agent, or Firm* — Franklin & Associates International Inc; Matthew F. Lambrinos

(57) ABSTRACT

A method for manufacturing a data line includes: forming a conductive layer on a substrate; forming a photoresist layer on a side of the conductive layer away from the substrate; exposing and then developing the photoresist layer to form a groove penetrating the photoresist layer, thus obtaining a patterned photoresist layer; and depositing a functional material electrochemically on the patterned photoresist layer, then removing the patterned photoresist layer to obtain the conductive layer with the patterned functional material layer, thereby obtaining the data line.

4 Claims, 7 Drawing Sheets

(58) Field of Classification Search
USPC .......................................................... 438/158
See application file for complete search history.

(56) References Cited

FOREIGN PATENT DOCUMENTS

| | | | |
|---|---|---|---|
| CN | 104617042 | * | 5/2015 |
| CN | 104617042 | A | 5/2015 |
| WO | 2014036785 | A1 | 3/2014 |
| WO | 2017014605 | A1 | 1/2017 |

* cited by examiner

METHOD FOR MANUFACTURING DATA LINE, METHOD FOR MANUFACTURING ARRAY SUBSTRATE AND DISPLAY DEVICE

CROSS-REFERENCE TO RELATED APPLICATIONS

This application claims the benefit of Chinese Patent Application No. 2020107330582, filed on Jul. 27, 2020, the entire content of which is incorporated herein in its entirety.

TECHNICAL FIELD

The present disclosure relates to the field of display technology, in particular to a method for manufacturing a data line, a method for manufacturing an array substrate, and a display.

BACKGROUND

TFT (Thin Film Transistor) is a type of active matrix liquid crystal display device, each liquid crystal pixel on it is driven by a thin film transistor integrated behind the pixel. Having advantages such as high responsiveness, high brightness, and high contrast, TFT display is the mainstream display device. An array substrate of the TFT display includes multiple components, such as a data line and a gate. The conductivity of the data line directly affects the performance of the array substrate. Conventionally, the data line is usually manufactured by forming a metal layer on a substrate and etching the metal layer to form a pattern to obtain the data line. However, the data line obtained by such a method has a low conductivity, which affects the performance of the array substrate.

SUMMARY

According to various embodiments, a method for manufacturing a data line is provided.

A method for manufacturing a data line includes: forming a conductive layer on a substrate; forming a photoresist layer on a side of the conductive layer away from the substrate; exposing and then developing the photoresist layer to form a groove penetrating the photoresist layer, thus obtaining a patterned photoresist layer; and depositing a functional material electrochemically on the patterned photoresist layer, then removing the patterned photoresist layer to obtain the conductive layer with a patterned functional material layer, thereby obtaining the data line.

A method for manufacturing an array substrate includes: forming a gate layer on a substrate; forming an insulating layer on a side of the gate layer away from the substrate; forming a first conductive layer on the insulating layer; forming a first photoresist layer on a side of the conductive layer away from the substrate; exposing and then developing the first photoresist layer to form a first groove penetrating the first photoresist layer, thus obtaining a patterned first photoresist layer; and depositing a first functional material electrochemically on the patterned first photoresist layer, then removing the patterned first photoresist layer to obtain the first conductive layer with a patterned first functional material layer, thereby obtaining the array substrate.

A display device is provided having the data line or the array substrate manufactured using the above method.

In the above-mentioned method, the patterned functional material layer with better density can be obtained by depositing the functional material electrochemically, which is beneficial to increase the conductivity of the data line. It is verified by experiments that the data line obtained using the above method has a conductivity of $2.3 \times 10^6$ S/m to $3.4 \times 10^6$ S/m, which is higher than that obtained by conventional method.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Figure 1:
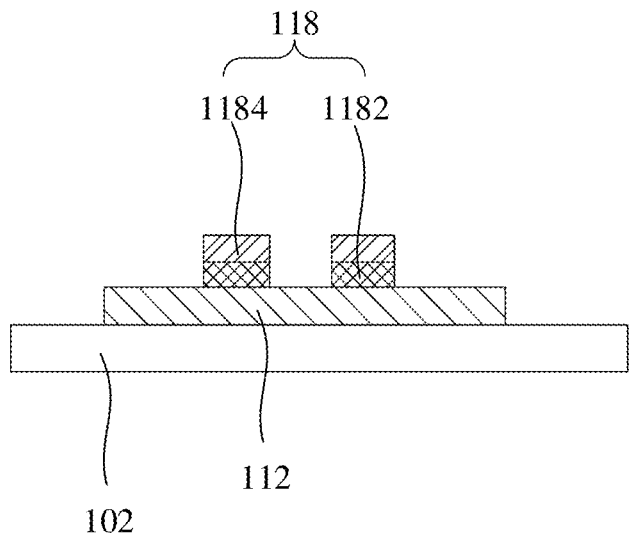
FIG. 1 is a schematic view of a data line according to an embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As shown in FIG. 1, a data line 110 according to an embodiment includes a substrate 102, a conductive layer 112 formed on the substrate 102, and a patterned functional material layer 118 formed on the conductive layer 112. The data line 110 has a higher conductivity, which can shorten the charge and discharge time of an array substrate.

Figure 2:
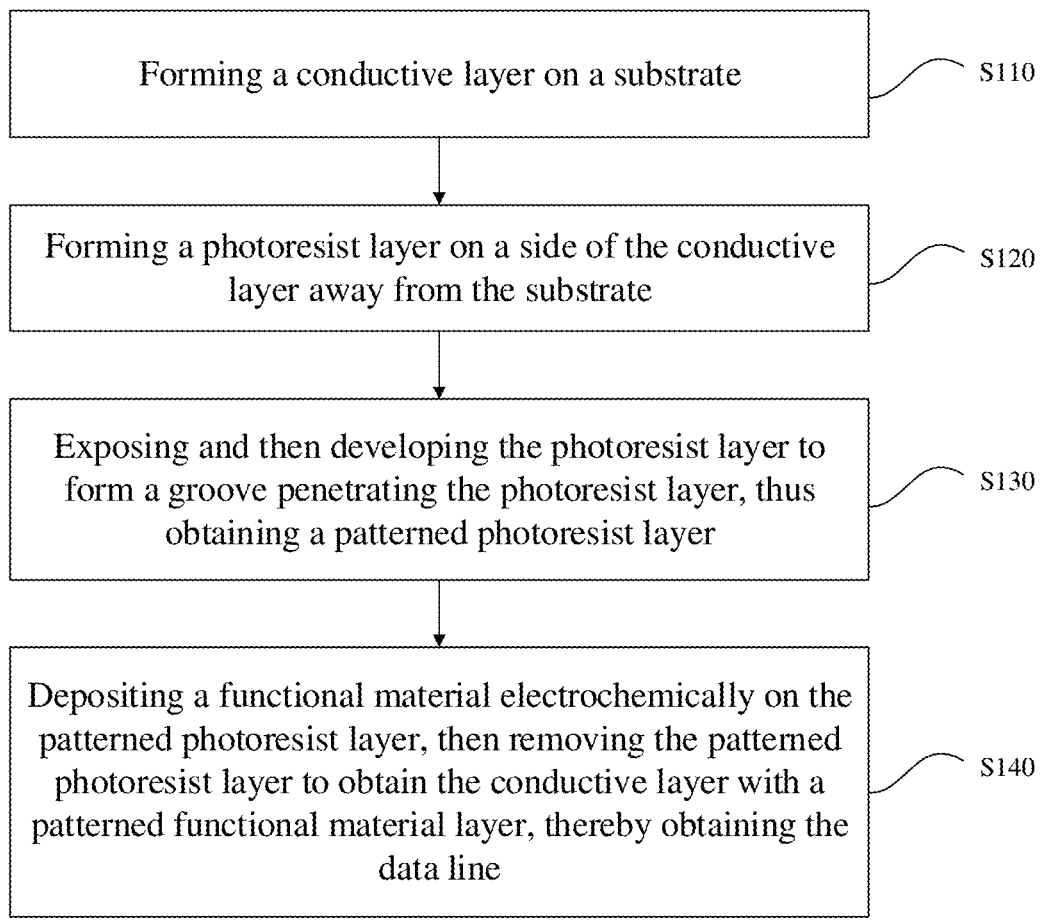
FIG. 2 is a flowchart of a method for manufacturing the data line according to an embodiment.

Referring to FIG. 2, a method for manufacturing a data line 110 is provided. Specifically, the method includes the following steps:

In step S110, a conductive layer 112 is formed on a substrate 102

Figure 3:
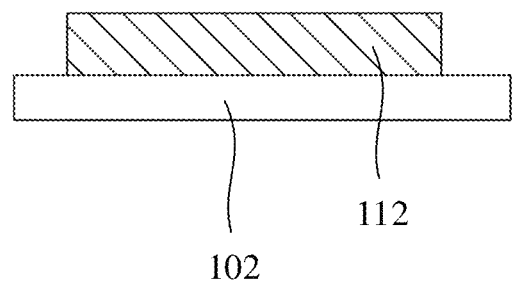
FIG. 3 is a schematic view showing forming the conductive layer on the substrate.

Referring to FIG. 3, by forming the conductive layer 112 on the substrate 102, the adhesion between the data line 110 and the substrate 102 can be increased.

In an embodiment, the substrate 102 can be a glass substrate, a plastic substrate, or a flexible substrate. In an embodiment, the substrate 102 has a thickness of 0.2 mm to 1 mm.

In an embodiment, the conductive layer 112 is a metal conductive layer. For example, the conductive layer 112 can be a molybdenum layer, a titanium layer, or an aluminum layer. In an embodiment, the conductive layer 112 has a thickness of 300 A to 800 A.

In an embodiment, in the step of forming the conductive layer 112 on the substrate 102, the conductive layer 112 is formed on the substrate 102 by deposition, e.g. by vapor deposition or electrochemical deposition. More specifically, the deposition can be vacuum evaporation, sputtering coating, arc plasma coating, or ion coating. It should be noted that the method of forming the conductive layer 112 on the substrate 102 is not limited to the above method, and other methods such as chemical plating or atomic layer deposition may also be utilized.

In step S120, a photoresist layer 114 is formed on a side of the conductive layer 112 away from the substrate 102.

Figure 4:
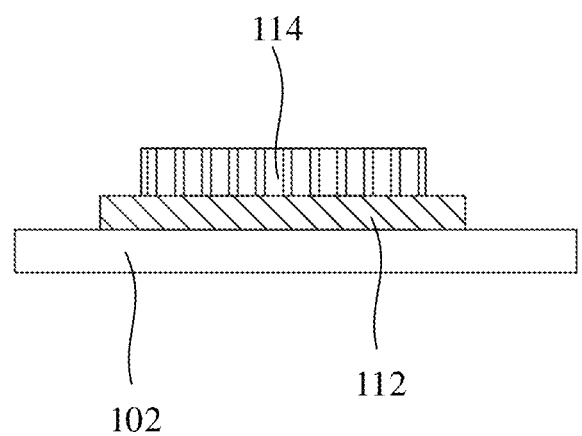
FIG. 4 is a schematic view showing forming the photoresist layer on the side of the conductive layer away from the conductive layer.

Specifically, referring to FIG. 4, a photoresist is coated on the side of the conductive layer 112 away from the substrate 102, thus obtaining the photoresist layer 114.

In an embodiment, the photoresist layer 114 has a thickness of 1.5 μm to 2.5 μm.

In step S130, a side of the photoresist layer 114 away from the conductive layer 112 is exposed and then developed to form a groove 116 penetrating the photoresist layer 114, thus obtaining a patterned photoresist layer 114.

Figure 5:
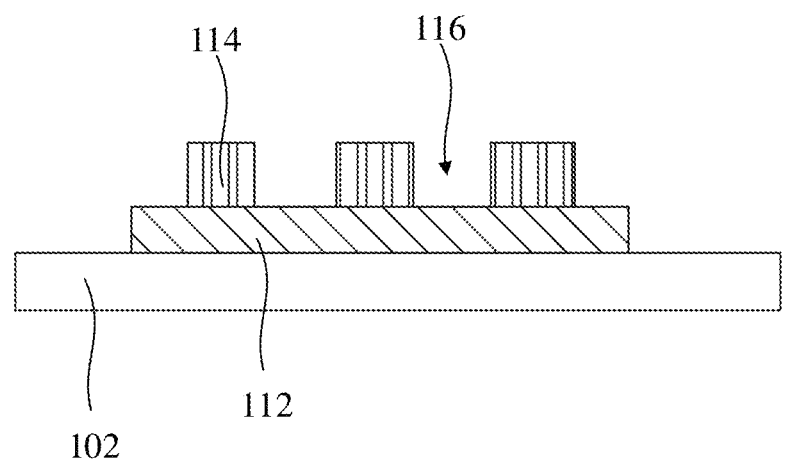
FIG. 5 is a schematic view showing exposing and then developing the side of the photoresist layer away from the conductive layer.

Specifically, referring to FIG. 5, the side of the photoresist layer 114 away from the conductive layer 112 is exposed using a mask, then developed to form the groove 116 penetrating the photoresist layer 114.

Figure 6:
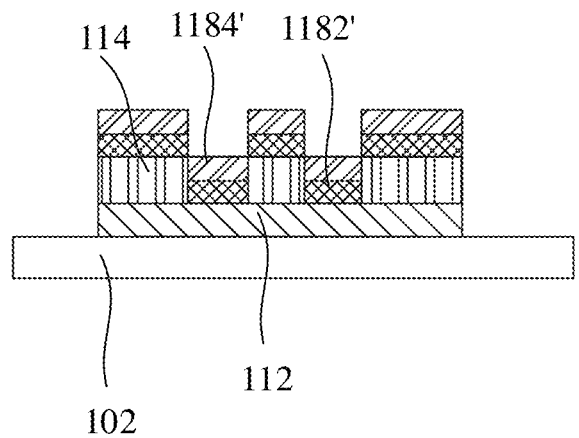
FIG. 6 is a schematic view showing depositing a metal material and a barrier material electrochemically on the patterned photoresist layer.

In step S140, referring to FIG. 6, a functional material is electrochemically deposited on the patterned photoresist layer 114, and the patterned photoresist layer 114 is then removed to obtain the conductive layer 112 with a patterned functional material layer 118, thereby obtaining the data line 110.

The conventional patterned layer is formed on metal by etching the metal. However, the patterned layer obtained by such a method has a low conductivity, which affects the performance of the array substrate containing the data line. Electrochemical deposition refers to a technology in which under the action of an external electric field, positive and negative ions migrate in an electrolyte and the redox reaction of gain and loss of electrons occurs on the electrodes, thereby forming a plating layer. The patterned functional material layer 118 manufactured by the electrochemical deposition method has good density and high conductivity, which is beneficial to shorten the charging time of the array substrate containing the data line 110 and ensures a good performance of the array substrate.

In an embodiment, a temperature for electrochemical deposition is 10° C. to 35° C. By performing electrochemical deposition at room temperature, it can avoid a decrease in conductivity caused by poor flatness due to the generation of coarse particles, and the conductivity of the patterned functional material layer 118 is further increased.

In an embodiment, step S140 specifically includes: depositing a metal material and a barrier material sequentially and electrochemically on the photoresist layer 114, then removing the photoresist layer 114 to obtain the conductive layer 112 with a patterned metal layer 1182 and a patterned barrier layer 1184 which are stacked.

Referring to FIG. 1, by forming the patterned barrier layer 1184 on the patterned metal layer 1182, the patterned metal layer 1182 can be prevented from being oxidized or contaminated, so as to improve the adhesion between the patterned metal layer 1182 and other components.

In an embodiment, the patterned metal layer 1182 has a thickness of 2000 A to 4000 A, and the patterned barrier layer 1184 has a thickness of 2000 A to 4000 A.

In an embodiment, the metal material is copper. It should be noted that, in other embodiments, the metal material may also be other metal materials, such as aluminum. Further, the barrier material is molybdenum and titanium.

The conventional patterned layer is formed by etching the copper layer using hydrogen peroxide. The etching rate is relatively slow, and the hydrogen peroxide is easily decomposed by high-concentration metal ions, releasing a large amount of heat and causing an explosion, which results in high security risk. According to the present embodiment, the patterned metal layer 1182 is a copper layer, which can increase the conductivity of the data line 110, reduce the RC time (i.e. charging and discharging time), increase the refresh rate of the array substrate containing the data line 110, and reduce the charging time of the array substrate. In this embodiment, through the electrochemical deposition method, the patterned metal layer 1182 can be formed with a faster deposition rate without etching, which can avoid the problem of explosion due to the heat released by the decomposition of hydrogen peroxide, resulting in higher safety. Further, the patterned barrier layer 1184 can be an aluminum layer, a molybdenum layer or a titanium layer.

It should be noted that, the patterned metal layer 1182 is not limited to the copper layer, and the patterned metal layer 1182 may also be other components, for example, an aluminum layer. In the case where the patterned metal layer 1182 is the aluminum layer and the patterned barrier layer 1184 is the aluminum layer, the aluminum layer with a thickness of the sum of the thickness of the patterned metal layer 1182 and the patterned barrier layer 1184 can be directly deposited in the groove 116 at one time, thus forming the patterned metal layer 1182 and the patterned barrier layer 1184 simultaneously on the conductive layer 112.

In an embodiment, the metal material and the barrier material are sequentially electrochemically deposited on the patterned photoresist layer 114, so as to shorten the time interval between the forming of the patterned metal layer 1182 and the forming of the patterned barrier layer 1184, and further reduce the oxidation of the patterned metal layer 1182, thus improving the adhesion between the patterned metal layer 1182 and other components.

Figure 7:
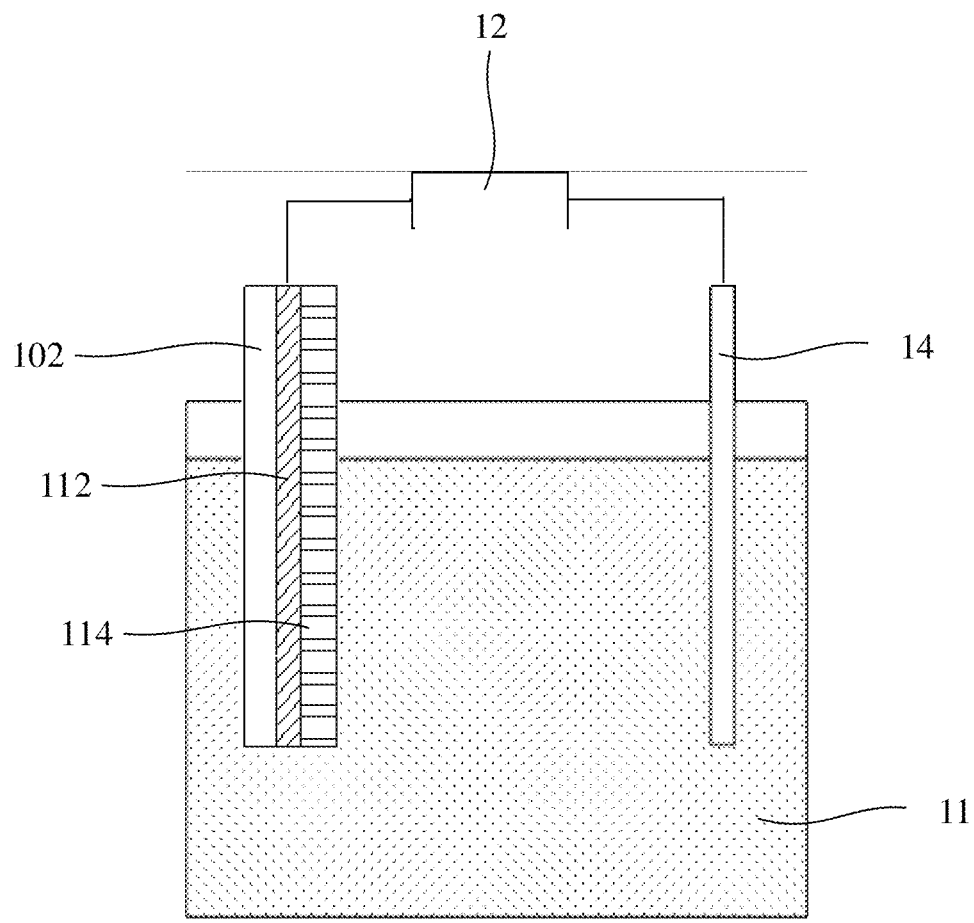
FIG. 7 is a schematic view showing depositing a metal layer and a barrier layer electrochemically on the patterned photoresist layer.

Referring to FIG. 7, in an embodiment, the step of depositing the metal material and the barrier material sequentially and electrochemically on the patterned photoresist layer 114 includes: placing the patterned photoresist layer 114 in an electrolytic bath 11, electrically connecting the conductive layer 112 and a counter electrode 14 to both ends of a power source 12, respectively, and placing the conductive layer 112 and the counter electrode 14 into an electrolyte for electrochemical deposition. Further, the photoresist layer 114 and the counter electrode 14 are is oppositely arranged.

Referring to FIG. 5, in an embodiment, the step of depositing a metal material and a barrier material sequentially and electrochemically on the photoresist layer 114 includes: placing the patterned photoresist layer 114 into an electrolyte containing a first ion and a second ion, energizing the electrolyte under a first reduction potential or a first reduction current, such that the first ion is reduced and deposited on the patterned photoresist layer 114 to form the metal material 1182'; and energizing the electrolyte at a second reduction potential or a second reduction current, such that the second ion is reduced and deposited on the metal material 1182' to form a barrier material 1184'.

By changing the potential, the metal material 1182' and the barrier material 1184' can be continuously and sequentially deposited, so as to prevent the patterned metal layer 1182 from being oxidized or contaminated. Further, the power source 12 is a pulse power source.

In an embodiment, the first ion is $Cu^{2+}$. The second ion is $MoO_4^{2-}$ or $Ti^{2+}$. In the electrochemical deposition process, the reaction formula of $Cu^{2+}$ is that: $Cu^{2+}+2e=Cu$; the reaction formula of $MoO_4^{2-}$ is that: $MoO_4^{2-}+8H^++6e-=Mo+2H_2O$. It should be noted that the first ion is not limited to $Cu^{2+}$, and may also be other ions, for example, $Al^{3+}$.

Further, when the first ion is $Cu^{2+}$ and the second ion is $MoO_4^2$, the counter electrode 14 is a Pt (platinum) electrode or a Ti electrode. It should be noted that the corresponding counter electrode 14 can be provided according to different first ions and second ions, so as to reduce the first ions and the second ions.

In an embodiment, the first ion is $Cu^{2+}$, and the first reduction potential is 0.3419V.

In an embodiment, the first ion is $Cu^{2+}$, and the density of the first reduction current is 1.5 $A/dm^2$ to 8.0 $A/dm^2$.

In an embodiment, the second ion is $MoO_4^{2-}$, and the second reduction potential is −0.0036V.

In an embodiment, the second ion is $MoO_4^2$, and the density of second reduction potential is 0.5 $A/dm^2$ to 1.2 $A/dm^2$.

In an embodiment, the second ion is $Ti^{2+}$, and the second reduction potential is −1.2 V to −1.7 V.

In an embodiment, the second ion is $Ti^{2+}$, and the density of second reduction potential is 5 $A/dm^2$ to 50 $A/dm^2$.

In an embodiment, the first ion is $Cu^{2+}$, the second ion is $MoO_4^{2-}$, the second reduction potential is −0.0036V, and the first reduction potential is 0.3419V. Such a setting can ensure that the second ion will not be reduced at the same time when the first ion is reduced, and can ensure that the patterned metal layer 1182 that has been formed will not be affected when the second ion is reduced.

In an embodiment, the electrolyte contains 1.5 mol/L to 4.0 mol/L of the first ion and 0.25 mol/L to 0.5 mol/L of the second ion. Such a setting can ensure the deposition of the patterned metal layer 1182 and the patterned barrier layer 1184, and ensure the performance of the patterned functional material layer 118.

In an embodiment, the first ion is $Cu^{2+}$, and the electrolyte contains 1.5 mol/L to 4.0 mol/L of the first ion. During manufacturing the electrolyte, $Cu^{2+}$ is added in a form of a soluble copper salt. Further, the soluble copper salt is at least one selected from a group consisting of copper sulfate, copper nitrate, and copper chloride. It should be noted that the soluble copper salt is not limited to the copper salt as mentioned above, and may also be other soluble copper salts commonly used in an electroplating process.

In an embodiment, the second ion is $MoO_4^{2-}$, and the electrolyte contains 0.25 mol/L to 0.5 mol/L of the second ion. During manufacturing the electrolyte, $MoO_4^{2-}$ is added in a form of soluble molybdate. Further, the soluble molybdate is at least one selected from a group consisting of sodium molybdate and potassium molybdate. It should be noted that the soluble molybdate is not limited to the soluble molybdate as mentioned above, and may also be other soluble molybdates commonly used in an electroplating process. Furthermore, the second ion is $MoO_4^{2-}$, and the electrolyte contains 1.5 mol/L to 4.0 mol/L of $Cu^{2+}$ and 0.25 mol/L to 0.5 mol/L of $MoO_4^{2-}$.

In an embodiment, the first ion is $Ti^{2+}$, and the electrolyte contains 0.25 mol/L to 0.5 mol/L of the second ion. During manufacturing the electrolyte, $Ti^{2+}$ is added in a form of soluble titanium salt. Further, the soluble titanium salt is at least one of selected from a group consisting of titanium chloride and titanium sulfate.

Furthermore, the electrolyte further contains 30 g/L to 100 g/L of an acid. Further, the acid is at least one selected from a group consisting of H2SO4, HCl, and $H_3PO_4$. It should be noted that the acid is not limited to the acid as mentioned above, and may also be other acids commonly used in an electroplating process.

The electrolyte further contains 0.3 mL/L to 1 mL/L of a brightener. The brightener is used to remove oil stains and impurities remaining on a metal surface and maintain external cleanliness, glossiness and color fastness of the metal surface. Further, the brightener is at least one selected from a group consisting of sodium dodecyl sulfate, polyethyleneglycol, and sodium allylsulfonate. The polyethyleneglycol (PEG) can be PEG400, PEG1000, or PEG4000. It should be noted that the brightener is not limited to the brightener as mentioned above, and may also be other brighteners commonly used in an electroplating process.

The electrolyte further contains a soluble chloride salt. Further, the soluble chlorine salt is at least one selected from a group consisting of sodium chloride, potassium chloride, and magnesium chloride. In the electrolyte, a concentration of chloride ions of the soluble chloride salts is 30 mg/L to 120 mg/L. It should be noted that the soluble chloride salt is not limited to the chloride salt as mentioned above, and may also be other soluble chloride salts commonly used in an electroplating process.

The electrolyte further contains 0.1 mL/L to 0.8 mL/L of a leveling agent. By adding the leveling agents, the flatness of the plating layer can be improved, such that a surface of the plating layer can be smoother. The leveling agent is at least one selected from a group consisting of polystyrene, polyacrylic acid, and polyvinyl alcohol. It should be noted that the leveling agent is not limited to the leveling agent as mentioned above, and can also be other leveling agents commonly used in an electroplating process.

The electrolyte further contains 0.1 mL/L to 1.5 mL/L of an additive. The additive is at least one selected from a group consisting of a lubricant and a starter. The starter can remove burrs of the plating layer. It should be noted that the additive is not limited to the additive as mentioned above, and may also be other additives commonly used in an electroplating process.

In an embodiment, the electrolyte contains 1.5 mol/L to 4.0 mol/L of $Cu^{2+}$, 0.25 mol/L to 0.5 mol/L of $MoO_4^{2-}$, the soluble chloride salt (a final concentration of chloride ions of 30 mg/L to 120 mg/L), 30 g/L to 100 g/L of the acid, 0.3 mL/L to 1 mL/L of the brightener, 0.1 mL/L to 0.8 mL/L of the leveling agent, and 0.1 mL/L to 1.5 mL/L of the additive. The electrolyte with such setting can obtain the patterned metal layer 1182 and the patterned barrier layer 1184 that are smooth and flat, so as to ensure the conductivity of the gate 126.

In an embodiment, a method of removing the photoresist layer 114 is to strip off the photoresist layer 114. Further, the photoresist layer 114 is removed by an ashing process. It should be noted that the barrier material 1184' and the metal material 1182' formed on the photoresist layer 114 are both removed along with the photoresist layer 114, thus forming the patterned metal layer 1182 and the barrier layer 1184 which are stacked.

In the above methods for manufacturing the data line 110, the conductive layer 112 is formed on the substrate 102. The photoresist layer 114 is formed on the side of the conductive layer 112 away from the substrate 102. The photoresist layer 114 is exposed and then developed to form the groove 116 penetrating the photoresist layer, thus obtaining the patterned photoresist layer 114. The functional material is deposited electrochemically on the patterned photoresist layer 114. Then, the photoresist layer 114 is removed to obtain the conductive layer 112 with the patterned functional material layer 118, thereby obtaining the data line 110. The patterned functional material layer 118 is formed by the electrochemical deposition, such that the patterned functional material layer 118 with better density can be obtained, which is beneficial to improve the conductivity of the data line 110. It is verified by experiments that the conductivity of the data line 110 is $2.3 \times 10^6$ S/m to $3.4 \times 10^6$ S/m.

In addition, the patterned metal layer 1182 is formed between the conductive layer 112 and the patterned barrier layer 1184 by the electrochemical deposition process, which can avoid a poor surface flatness of the patterned functional material layer 118 caused by the formation of coarse particles, and thus avoid the problem that the conductivity of the patterned metal layer 1182 decreases due to the poor flatness of the patterned functional material layer 118. Moreover, using copper as the patterned metal layer 1182 can increase the conductivity of the patterned metal layer 1182, reduce the RC time, increase the refresh rate of the array substrate containing the data line 110, and reduce the charging time of the array substrate with the data line 110.

In the above methods for manufacturing the data line 110, by setting the electrolyte containing the first ion and the second ion, and by controlling a pulse voltage, the patterned metal layer 1182 and the patterned barrier layer 1184 can be deposited continuously, which can effectively prevent the patterned metal layer 1182 from being oxidized or contaminated and thus prevent affecting the conductivity of the data line 110.

It can be understood that the manufacturing method of the data line 110 is not limited to the methods mentioned above. For example, the method for manufacturing the data line of a second embodiment is substantially the same as the method for manufacturing the data line 110 of the first embodiment, except for the step of depositing the metal material and the barrier material sequentially and electrochemically on the patterned photoresist layer, comprising: placing the patterned photoresist layer into a first electrolyte containing the first ion, performing a first electrochemical deposition such that the first ion is reduced and deposited the metal material in the groove to form the metal material; placing the patterned photoresist layer with the metal material into a second electrolyte containing the second ion, performing a second electrochemical deposition such that the second ion is reduced and deposited on the metal material to form the barrier material.

In an embodiment, the first electrolyte is substantially the same as the electrolyte of the above embodiments, except that the first electrolyte does not contain the second ion.

In an embodiment, the second electrolyte contains the second ion with an initial concentration of 0.25 mol/L to 0.5 mol/L.

Further, the second electrolyte contains 20 g/L to 70 g/L of an acid. Further, the acid is at least one selected from a group consisting of H2SO4, HCl, and $H_3PO_4$. It should be noted that the acid is not limited to the acid as mentioned above, and may also be other acids commonly used in an electroplating process.

The second electrolyte further contains 0.2 mL/L to 0.8 mL/L of a brightener. Further, the brightener is at least one selected from a group consisting of sodium dodecyl sulfate, polyethyleneglycol, and sodium allyl sulfonate. The polyethyleneglycol (PEG) is PEG400, PEG1000, or PEG4000. It should be noted that the brightener is not limited to the brightener as mentioned above, and may also be other brighteners commonly used in an electroplating process.

The second electrolyte further contains 0.1 mL/L to 0.6 mL/L of a leveling agent. The leveling agent is at least one selected from a group consisting of polystyrene, polyacrylic acid, and polyvinyl alcohol. It should be noted that the leveling agent is not limited to the leveling agent as mentioned above, and can also be other leveling agents commonly used in an electroplating process.

The second electrolyte further contains 0.1 mL/L to 1.5 mL/L of an additive. The additive is at least one selected from a group consisting of a lubricant and a starter. It should be noted that the additive is not limited to the additive as mentioned above, and may also be other additives commonly used in an electroplating process.

In an embodiment, the second electrolyte contains 0.25 mol/L to 0.5 mol/L of $MoO_4^{2-}$, 20 g/L to 70 g/L of the acid, 0.2 mL/L to 0.8 mL/L of the brightener, 0.1 mL/L to 0.6 mL/L of the leveling agent, and 0.1 mL/L to 1.5 mL/L of the additive. The metal layer and barrier layer that are smooth and flat can be obtained through the electrolyte with such setting, so as to ensure the conductivity of the gate.

In an embodiment, prior to the step of placing the patterned photoresist layer with the metal material into the second electrolyte containing the second ion, the method further includes: preparing the second electrolyte by adding the second ion into the first electrolyte. By adding the second ion into the first electrolyte to obtain the second electrolyte, the time interval between depositing the metal material and depositing the barrier material is shortened, such that the metal material and the barrier material are continuously deposited, thereby preventing the metal layer from being oxidized or contaminated.

Further, the step of depositing the functional material electrochemically on the patterned photoresist layer includes: placing the patterned photoresist layer into the first electrolyte, performing the first electrochemical deposition such that the first ion is reduced and deposited on the patterned photoresist layer to form the metal material, and the second ion is added to the first electrolyte to obtain the second electrolyte, performing the second electrochemical deposition under the second reduction potential when the concentration of the first ion in the first electrolyte was decreased to 10 g/L. Such a setting can not only continuously deposit the metal material and the barrier material but also avoid the mutual influence between the first ion and the second ion, thereby affecting the deposition of the metal material and the barrier material.

In an embodiment, the first ion in the first electrolyte has an initial concentration of 1.5 mol/L to 4.0 mol/L, and the second ion in the second electrolyte has an initial concentration of 0.25 mol/L to 0.5 mol/L.

In an embodiment, the second ion is $MoO_4^{2-}$. The first ion in the first electrolyte has an initial concentration of 1.5 mol/L to 4 mol/L. The second ion is added to the first electrolyte such that the second ion in the second electrolyte has an initial concentration of 0.25 mol/L to 0.5 mol/L.

In an embodiment, the second ion is $Ti^{2+}$. The first ion in the first electrolyte has an initial concentration of 1.5 mol/L to 4 mol/L. The second ion is added to the electrolyte such that The first ion in the first electrolyte has an initial concentration of 0.25 mol/L to 0.5 mol/L.

In an embodiment, in the step of placing the patterned photoresist layer into the first electrolyte, performing a first electrochemical deposition such that the first ion is reduced and deposited on the patterned photoresist layer to form the metal material, the first electrolyte is energized under a first reduction potential or a first reduction current, such that the first ion is reduced and deposited on the patterned photoresist layer to form the metal material. Further, the first reduction potential is 0.34V to 0.8V, and the density of the first reduction current is 1.5 $A/dm^2$ to 8 $A/dm^2$.

In an embodiment, in the step of performing the second electrochemical deposition such that the second ion is reduced and deposited on the metal material to form the barrier material, the second electrolyte is energized at the second reduction potential or the second reduction current, such that the second ion is reduced and deposited on the metal material to form the barrier material.

Further, the second ion is $MoO_4^{2-}$. The second reduction potential is −0.3V to 0.1V. The density of the second reduction current is 0.5 $A/dm^2$ to 1.2 $A/dm^2$. The second ion is $Ti^{2+}$. The second reduction potential is −1.2 V to −1.7 V. The second reduction current density is 5 $A/dm^2$ to 50 $A/dm^2$.

In the above method for manufacturing the data line, the first electrolyte containing the first ion and the second electrolyte containing the second ion is provided to electrochemically deposit the metal material and the barrier material respectively. When the photoresist layer is removed, the patterned metal layer and the patterned barrier layer which are stacked are formed, and the patterned functional material layer with better density can also be obtained such that the conductivity of the obtained data line can be improved. The obtained data line can be used to manufacture an array substrate with a shorter charging time.

Further, in the method for manufacturing the data line, the metal layer is deposited electrochemically using the first electrolyte containing the first ion, and when the first ion is consumed to have a lower concentration, the second ion is added into the first electrolyte to obtain the second electrolyte, thereby electrochemically depositing the barrier material. In this way, the metal material and the barrier material is continuously deposited by controlling the concentration of the first ion and the second ion, which can effectively prevent the metal layer from being oxidized or contaminated and affecting the conductivity of the data line.

It can be understood that the first electrolyte is not limited to the first electrolyte as mentioned above. The first electrolyte may also be the same as the electrolyte of the first embodiment. At this time, the first reduction potential or the first reduction current needs to be adjusted to reduce the first ion in the first electrolyte without reducing the second ion at the same time.

It can be understood that the forming the conductive layer on the substrate may further comprise: forming an insulating layer on the substrate, and forming the conductive layer on the insulating layer.

Figure 8:
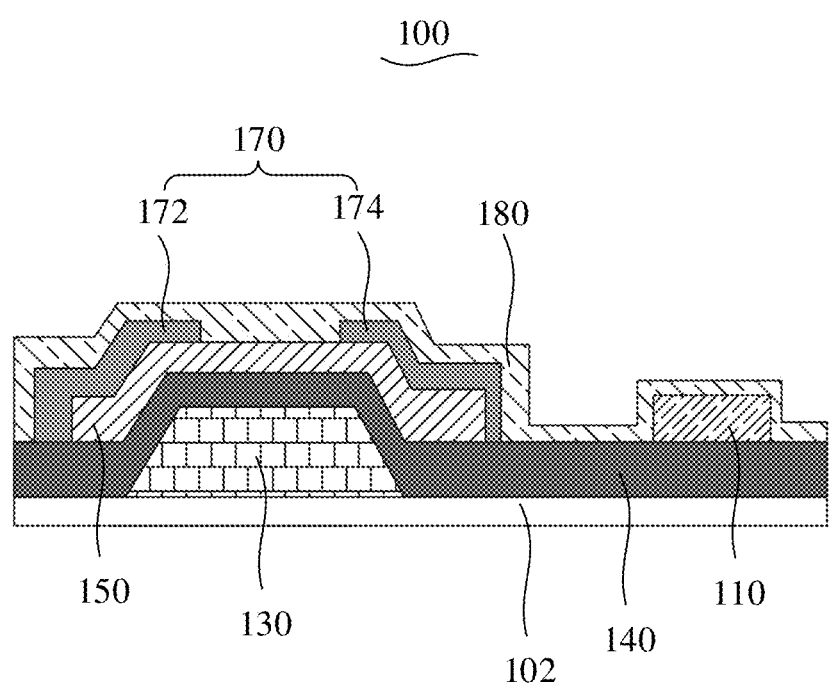
FIG. 8 is a schematic view of an array substrate in an embodiment.

Referring to FIG. 8, an array substrate 100 is provided according to an embodiment. The array substrate 100 includes a substrate 102, a data line 110, a gate layer 130, an insulating layer 140, an active layer 150, a source-drain electrode 170, and a protective layer 180. The gate layer 130 is formed on the substrate 102. The insulating layer 140 covers a part of the substrate 102 and covers the gate layer 130. The active layer 150 and the data line 110 are formed on a side of the insulating layer 140 away from the substrate 102, and the active layer 150 is positioned opposite the gate layer 130. The source-drain electrode 170 is formed on a side of the active layer 150 away from the insulating layer 140. A part of the source-drain electrode 170 covers a side of the insulating layer 140 away from the substrate 102, and the other part thereof covers a surface of the active layer 150. the source-drain electrode 170 includes a drain electrode 172 and a source electrode 174. The drain electrode 172 is spaced apart from the source electrode 174. A part of the drain electrode 172 covers the side of the insulating layer 140 away from the substrate 102, and the other part thereof covers the surface of the active layer 150. A part of the source electrode 174 covers the side of the insulating layer 140 away from the substrate 102, and the other part thereof covers the surface of the active layer 150. The source electrode 174 is electrically connected to the data line 110. The protective layer 180 covers the surfaces of the insulating layer 140, the source-drain electrode 170, and the active layer 150. The array substrate 100 has a shorter charging time.

Figure 9:
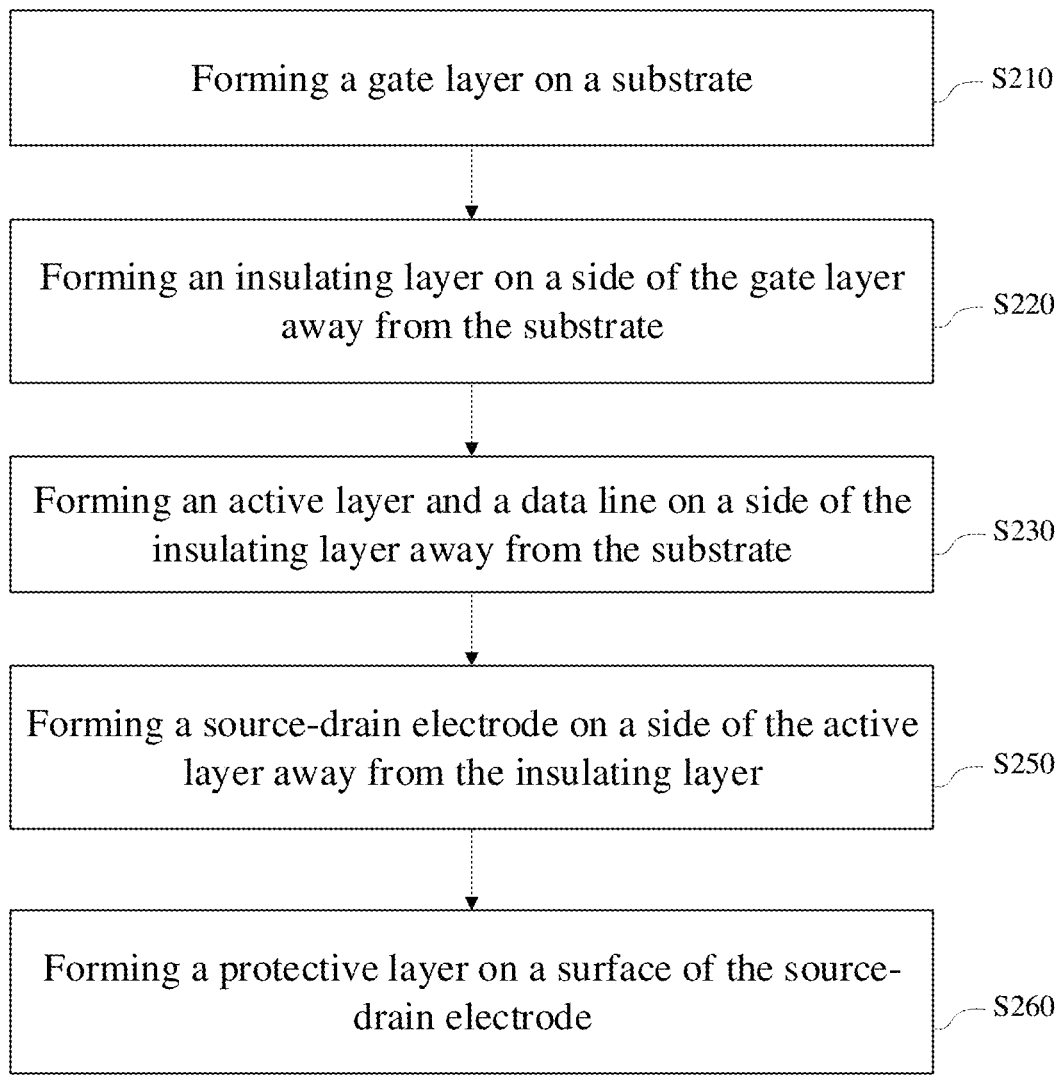
FIG. 9 is a flowchart of a method for manufacturing an array substrate according to another embodiment.

Referring to FIG. 9, a method for manufacturing the array substrate 100 according to an embodiment is provided, which includes the following steps.

In step S210, a gate layer 130 is formed on a substrate 102.

The gate layer 130 can be manufactured according to the first or the second embodiment of the method for manufacturing the data line.

Figure 10:
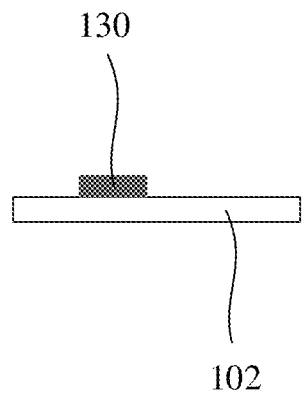
FIG. 10 is a schematic view showing forming the gate on the substrate.
Figure 11:
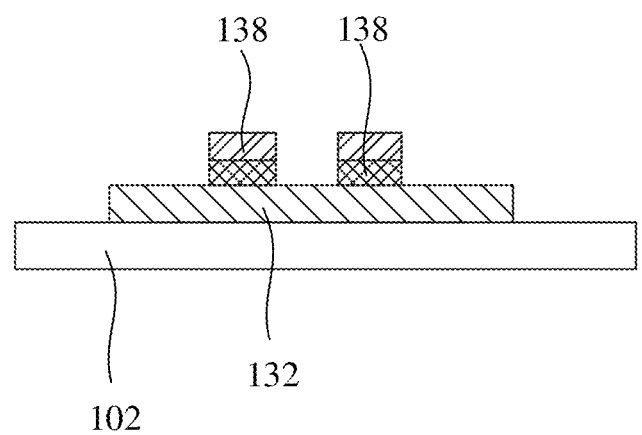
FIG. 11 is a schematic view showing forming the gate on the substrate viewed in another aspect.
Figure 12:
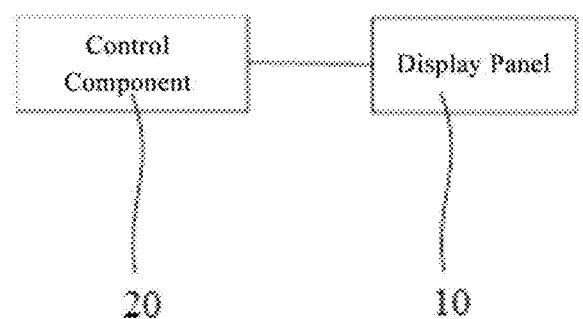
FIG. 12 is a block diagram of a display device according to an embodiment.

Referring to FIGS. 10 to 12, specifically, the step of forming the gate layer 130 on the substrate 102 includes steps of S211 to S214.

In step S211, a second conductive layer 132 is formed on the substrate 102.

By forming the second conductive layer 132 on the substrate 102, adhesion between the gate layer 130 and the substrate 102 can be increased.

In an embodiment, the substrate 102 is a glass substrate, a plastic substrate or a flexible substrate. In an embodiment, the substrate 102 has a thickness of 0.2 mm to 1 mm.

In an embodiment, the second conductive layer 132 is a metal conductive layer. Further, the second conductive layer 132 is a molybdenum layer or a titanium layer.

In an embodiment, in the step of forming the second conductive layer 132 on the substrate 102, the second conductive layer 132 is formed on the substrate 102 by deposition. Further, the deposition is vapor deposition or electrochemical deposition. Furthermore, the deposition is vacuum evaporation, sputtering coating, arc plasma coating, or ion coating. It should be noted that the method of forming the second conductive layer 132 on the substrate 102 is not limited to the above method, and other methods such as electroless plating or atomic layer deposition may also be used.

In an embodiment, the second conductive layer 132 has a thickness of 300 A to 800 A.

In step S212, a second photoresist layer is formed on a side of the second conductive layer 132 away from the substrate 102.

Specifically, a photoresist is coated on the side of the second conductive layer 132 away from the substrate 102 to obtain the second photoresist layer.

In an embodiment, the second photoresist layer has a thickness of 1.5 μm to 2.5 μm.

In step S213, a side of the second photoresist layer away from the second conductive layer 132 is exposed and then developed to form a second groove penetrating the second photoresist layer, thus obtaining a patterned second photoresist layer.

Specifically, the side of the second photoresist layer away from the second conductive layer 132 is exposed using a mask and then developed to form on the second photoresist layer the second groove penetrating the second photoresist layer.

In step S214, a second functional material is deposited electrochemically on the patterned second photoresist layer, then the patterned second photoresist layer is removed to obtain the second conductive layer 132 with a patterned second functional material layer 138, thereby obtaining the gate layer 130.

The conventional patterned second functional material layer is formed on metal by etching the metal. However, the patterned second functional material layer obtained by such a method has a low conductivity, which affects the performance of the array substrate containing the data line. Electrochemical deposition refers to a technology in which under the action of an external electric field, positive and negative ions migrate in an electrolyte and the redox reaction of gain and loss of electrons occurs on the electrodes, thereby forming a plating layer. The patterned second functional material layer 138 manufactured by the electrochemical deposition method has good density and high conductivity, which is beneficial to shorten the charging time of the array substrate containing the gate layer 130 and ensures a good performance of the array substrate.

In an embodiment, the operation of depositing a second functional material electrochemically on the patterned second photoresist layer, then removing the patterned second photoresist layer to obtain the second conductive layer 132 with a patterned second functional material layer 180 is the same as that of forming the conductive layer 112 with the patterned functional material layer 118 on the patterned photoresist layer 114 in the method for manufacturing the data line 110 in the first embodiment or that of forming the conductive layer with the patterned functional material layer on the patterned photoresist layer in the method for manufacturing the data line in the second embodiment, and will not be repeated here.

Manufacturing the gate layer 130 through the above manufacturing process can result in the gate layer 130 with higher conductivity, reduce the RC time, increase the refresh rate of the array substrate 100, and reduce the charging time of the array substrate.

In an embodiment, the gate layer 130 includes a gate and a gate line. The gate is electrically connected to the gate line.

In step S220, an insulating layer 140 is formed on a side of the gate layer 130 away from the substrate 102

Further, the insulating layer 140 covers a side of the substrate 102 adjacent to the second conductive layer 132 and covers the gate layer 130.

In an embodiment, the method of forming the insulating layer 140 on the side of the gate layer 130 away from the substrate 102 is a vapor deposition or an electrochemical deposition.

In an embodiment, the insulating layer 140 is SiNx, SiO2, or Al2O3.

In an embodiment, the insulating layer 140 has a thickness of 2000 A to 6000 A.

In step S230, an active layer 150 and a data line 110 is formed on a side of the insulating layer 140 away from the substrate 102.

In the illustrated embodiment, the active layer 150 is positioned opposite the gate layer 130.

In an embodiment, the active layer 150 is formed on the side of the insulating layer 140 away from the substrate 102 by a deposition process. Further, the deposition is vapor deposition or electrochemical deposition. Furthermore, the deposition is vacuum evaporation, sputtering coating, arc plasma coating, or ion coating.

In an embodiment, the active layer 150 is a semiconductor layer. Further, the active layer 150 is an amorphous silicon layer. It should be noted that the active layer 150 is not limited to the amorphous silicon layer, and may also be other semiconductor layers, such as polysilicon, metal oxide.

In an embodiment, the active layer 150 has a thickness of 600 A to 2000 A.

In an embodiment, the forming the data line 110 on the side of the insulating layer 140 away from the substrate 102 includes steps of S241 to S244.

In step S241, a second conductive layer is formed on a side of the insulating layer 140 away from the gate layer 130

In an embodiment, a manufacturing process of the second conductive layer is substantially the same as the manufacturing process of the conductive layer 112, except that the second conductive layer is formed on the side of the insulating layer 140 away from the gate layer 130.

In step S242, a second photoresist layer is formed on a side of the second conductive layer away from the insulating layer 140

In an embodiment, a manufacturing process of the second photoresist layer is substantially the same as the manufacturing process of the photoresist 134, except that the second photoresist layer is formed on the side of the second conductive layer away from the insulating layer 140.

In step S243, the second photoresist layer is exposed and then developed to form a second groove penetrating the second photoresist layer, thus obtaining a patterned second photoresist layer.

In an embodiment, the operation of S243 is the same as the operation of S143, and will not be repeated here.

In step S244, a second functional material is deposited electrochemically on the patterned second photoresist layer, then the second photoresist layer is removed to obtain a second conductive layer with a patterned second functional material layer, thereby obtaining the data line 110.

In an embodiment, an operation of S244 is the same as the operation of S144, which will not be repeated here.

It should be noted that there is no priority between S230 and S240. S240 can be performed first and then S230 is performed, or S230 can be performed first and then S240 is performed, or S240 and S230 can be operated in parallel.

In step S250, a source-drain electrode 170 is formed on a side of the active layer 150 away from the insulating layer 140.

In an embodiment, the source-drain electrode 170 has a thickness of 2500 A to 6000 A.

In an embodiment, a part of the source-drain electrode 170 covers a side of the insulating layer 140 away from the substrate 102, and the other part thereof covers a surface of the active layer 150.

Further, the source-drain electrode 170 includes a drain electrode 172 and a source electrode 174. The drain electrode 172 is spaced apart from the source electrode 174. A part of the drain electrode 172 covers the side of the insulating layer 140 away from the substrate 102, and the other part thereof covers the surface of the active layer 150. A part of the source electrode 174 covers the side of the insulating layer 140 away from the substrate 102, and the other part thereof covers the surface of the active layer 150. The source electrode 174 is electrically connected to the data line 110.

In an embodiment, the step of forming the source-drain electrode 170 on the side of the active layer 150 away from the insulating layer 140 includes steps of S251 to 254.

In step S251, a third conductive layer is formed on the side of the active layer 150 away from the insulating layer 140.

In an embodiment, a manufacturing process of the third conductive layer is substantially the same as that of the first conductive layer 131, except that the third conductive layer is formed on the side of the active layer 150 away from the insulating layer 140.

In step S252, a third photoresist layer is formed on a side of the third conductive layer away from the insulating layer 140.

In an embodiment, a manufacturing process of the third photoresist layer is substantially the same as the manufacturing process of the photoresist 131, except that the third photoresist layer is formed on the side of the third conductive layer away from the insulating layer 140.

In step S253, the third photoresist layer is exposed and developed to form a third groove penetrating the third photoresist layer, thus obtaining a third patterned photoresist layer.

In an embodiment, the operation of S253 is the same as the operation of S143, and will not be repeated here.

In step S254, a third functional material is deposited electrochemically on the third patterned photoresist layer, then the third patterned photoresist layer is removed to form a patterned third functional material layer, thus obtaining the source-drain electrode 170, wherein the source-drain electrode 170 comprises the third conductive layer and the patterned third functional material layer which are stacked.

In an embodiment, the operation of S243 is the same as the operation of S143, and will not be repeated here.

In an embodiment, an operation of S254 is the same as the operation of S144, and will not be repeated here.

The source-drain electrode 170 formed through the above manufacturing process can have a higher conductivity, reduce the RC time, increase the refresh rate of the array substrate 100, and reduce the charging time of the array substrate.

It should be noted that step S230 and step S250 are interchangeable. Step S250 can be performed first and then step S230 is performed, or step S230 can be performed first and then step S250 is performed, or step S250 and step S230 can be operated synchronously.

In an embodiment, after S230 and prior to S250, the method further includes forming an ohmic contact layer on a side of the active layer 150 away from the insulating layer 140. The ohmic contact layer is located between the active layer 150 and the source-drain electrode 170. By forming the ohmic contact layer between the source-drain electrode 170 and the active layer 150, the contact resistance between the drain electrode and the active layer 150 is reduced, and the contact resistance between the source electrode and the active layer 150 is reduced.

Furthermore, the ohmic contact layer covers the surface of the active layer 150. A part of the drain electrode 172 covers the side of the insulating layer 140 away from the substrate 102, and the other part thereof covers the ohmic contact layer. A part of the source electrode 174 covers the side of the insulating layer 140 away from the substrate 102, and the other part thereof covers the ohmic contact layer.

In an embodiment, the ohmic contact layer is formed on the side of the active layer 150 away from the insulating layer 140 by a deposition process. Further, the deposition is vapor deposition or electrochemical deposition. Furthermore, the deposition is vacuum evaporation, sputtering coating, arc plasma coating, or ion coating.

In an embodiment, the ohmic contact layer is made of amorphous silicon. Further, the ohmic contact layer is made of amorphous silicon doped with PH3 (phosphine). Furthermore, the ohmic contact layer is made of amorphous silicon doped with a concentration of 1-10% PH3.

In an embodiment, the ohmic contact layer has a thickness of 200 A to 1000 A.

In step S260, a protective layer 180 is formed on a surface of the source-drain electrode 170.

Further, the protective layer 180 covers the surfaces of the insulating layer 140, the source-drain electrode 170, and the active layer 150.

The protective layer 180 is formed to protect components such as the drain electrode 172, the source electrode 174, and the active layer 150.

In an embodiment, the protective layer 180 is a silicon nitride layer. It should be noted that the protective layer 180 is not limited to the silicon nitride layer, and may also be other protective layers 180, such as silicon oxide, or aluminum oxide.

In an embodiment, the protective layer 180 has a thickness of 1500 A to 5000 A.

In the above method for manufacturing the array substrate 100, the patterned functional material layer 118 of the gate 126, the source-drain electrode 170, or the data line 110 is manufactured in the liquid phase at room temperature by the electrochemical deposition process, which can avoid a poor surface flatness of the patterned functional material layer 118 caused by the formation of coarse particles, and thus avoid the problem that the conductivity of the gate 126, the source-drain electrode 170, or the data line 110 decreases due to the poor flatness of the patterned functional material layer 118. Moreover, using the copper as the patterned metal layer 1182 can increase the conductivity of the gate 126, the source-drain electrode 170, or the data line 110, reduce the RC time, increase the refresh rate of the array substrate 100, and reduce the charging time of the array substrate 100. The above methods for manufacturing the array substrate 100 can manufacture the array substrate 100 with better performance, which satisfies the requirements of large-scale and batch production.

It should be understood that a method for manufacturing the gate is not limited to the method as mentioned above, and may also be a method commonly used in other display technology fields. For example, in other embodiments, the metal layer and the photoresist layer are sequentially formed on the substrate. Then, the photoresist layer is exposed and developed by the yellow light process. Then, the metal layer is etched to pattern the metal layer to obtain the gate.

It can be understood that a method for manufacturing the gate line is not limited to the method as mentioned above, and may also be a method commonly used in other display technology fields. For example, in other embodiments, the metal layer and the photoresist layer are sequentially formed on the substrate. Then, the photoresist layer is exposed and developed by the yellow light process. Then, the metal layer is etched to pattern the metal layer to obtain the gate line.

It can be understood that a method for manufacturing the source-drain electrode 170 is not limited to the method as mentioned above, and may also be a method commonly used in other display technology fields. For example, in an embodiment, the method for manufacturing the source-drain electrode is the same as that for manufacturing the gate layer in the second embodiment, except that the second conductive layer is formed on the side of the insulating layer away from the gate layer. Further, for another example, in other embodiments, the metal layer and the photoresist layer are formed on the side of the active layer away from the insulating layer. Then, the photoresist layer is exposed and developed by the yellow light process. Then, the metal layer is etched to pattern the metal layer to obtain the source-drain electrode.

It can be understood that a method for manufacturing the data line 110 is not limited to the method as mentioned above, and may also be a method commonly used in other display technology fields. For example, in an embodiment, the method for manufacturing the data line is the same as that for manufacturing the gate layer in the second embodiment, except that the third conductive layer is formed on the side of the active layer away from the insulating layer. Further, for another example, in other embodiments, the metal layer and the photoresist layer are formed on the side of the insulating layer away from the substrate. Then, the photoresist layer is exposed and developed by the yellow light process. Then, the metal layer is etched to pattern the metal layer to obtain the data line.

In addition, an array substrate 100 according to an embodiment is further provided, which can be obtained by the method for manufacturing the array substrate according to the above embodiments.

The above array substrates 100 have a short RC time and a short charging time, and can be used to manufacture a display panel 10 with a higher refresh rate and a shorter charging time.

Further, a display device according to an embodiment is provided, which includes the array substrate 100 according to the above embodiments.

Referring to FIG. 12, in an embodiment, the display device is the display panel 10. Further, the display panel 10 is a liquid crystal display panel, an Organic Light-Emitting Diode (OLED) display panel, or a Quantum Dot light Emitting Diode (QLED) display panel. The above display panel 10 has a higher refresh rate and a shorter charging time, and can be used to manufacture a display device with excellent performance.

In other embodiments, the display device includes the display panel 10 and a control component 20.

Figure 13:
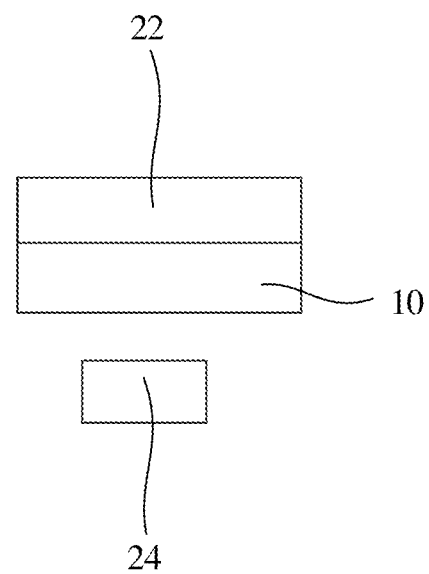
FIG. 13 is a block diagram of a display device according to another embodiment.

Referring to FIG. 13, in an embodiment, the control component 20 includes at least one of a polarizing module 22 and a backlight module 24. The backlight module 24 is used to provide a backlight. The polarizing module 22 is used to polarize light. Further, the control component 20 includes both the polarizing module 22 and the backlight module 24. The polarizing module 22 and the backlight module 24 are located on both sides of the display panel 10.

In an embodiment, the display device is a liquid crystal display device, an OLED display device, or a QLED display device.

In an embodiment, the display device is a curved display panel. It should be noted that the display device is not limited to the curved display panel, and may also be a flat display panel.

Specific examples are as follows:

Unless otherwise specified, the following examples do not comprise other components except unavoidable impurities. Unless otherwise specified, the drugs and instruments used in the examples are conventional choices in the art. The experimental methods that do not specify specific conditions in the examples are implemented in accordance with conventional conditions, such as the conditions described in the prior art or the method recommended by the manufacturer.

Unless otherwise specified, $Cu^{2+}$ is added in the form of copper sulfate, $MoO_4^{2-}$ is added in the form of sodium molybdate; $Ti^{2+}$ is added in the form of titanium chloride in the following examples. The chloride ion in the electrolyte indicated in the following examples is the chloride ion in the soluble chloride salt. The substrate is a glass substrate.

Example 1

The manufacturing process of the array substrate of this example was as follows:

(1) A gate layer including a gate and a gate line was formed on a substrate as follows:

(a) A conductive layer was formed on the substrate by sputtering. The conductive layer was a titanium layer and had a thickness of 400 A. The substrate had a thickness of 0.2 mm to 1 mm.

(b) A metal layer and a barrier layer was formed sequentially on a side of the conductive layer away from the substrate by sputtering. The metal layer was made of copper and had a thickness of 4000 A. The barrier layer was made of titanium and had a thickness of 300 A.

(c) A photoresist layer was coated on a side of the barrier layer away from the substrate.

(d) A side of the photoresist layer away from the barrier layer was exposed using a mask and then developed to form a groove penetrating the photoresist layer, thus obtaining a patterned photoresist layer. The metal layer and the barrier layer were etched by an etching process until the conductive layer was exposed and the photoresist layer was removed, leaving the unetched part of the metal layer and the barrier layer to obtain the conductive layer with a patterned functional material layer, thereby obtaining the gate layer. The step of etching the metal layer and the barrier layer by the etching process until the conductive layer was exposed was as follows: the photoresist layer with the groove was placed into an etching solution for etching. The etching solution was composed of 5 g/L of nitric acid, 40 g/L of phosphoric acid, and 20 g/L of oxalic acid. The temperature for the etching process was 30° C. The time of the etching process was 85 s.

(2) An insulating layer was formed on a side of the gate layer away from the substrate. The insulating layer was a silicon nitride layer and had a thickness of 4000 A.

(3) An active layer was formed on a side of the insulating layer away from the substrate. The active layer was formed opposite the gate. The active layer was an amorphous silicon layer and had a thickness of 1500 A.

(4) A data line which was separated from the active layer was formed on the side of the insulating layer away from the substrate as follows:

(a) A conductive layer was formed on the active layer by sputtering. The conductive layer was an aluminum layer and had a thickness of 400 A.

(b) A photoresist layer was coated on a side of the conductive layer away from the substrate. The photoresist layer had a thickness of 2.2 μm.

(c) The photoresist layer was exposed using a mask and then developed to form a groove penetrating the photoresist layer, thus obtaining a patterned photoresist layer.

(d) A functional material was deposited electrochemically on the patterned photoresist layer and then the photoresist layer was stripped off to obtain the conductive layer with a patterned metal layer and a patterned barrier layer which were stacked, thereby obtaining the data line. The depositing the functional material electrochemically on the patterned photoresist layer was as follows: the patterned photoresist layer was placed into an electrolyte; the electrolyte was energized under a first reduction potential such that a first ion was reduced and deposited on the patterned photoresist layer to form a metal material; and the electrolyte was energized under a second reduction potential such that a second ion was reduced and deposited on the patterned photoresist layer to form a barrier material. The electrochemical deposition was performed in the same electrolyte. The electrolyte was composed of 190 g/L of $Cu^{2+}$, 25 g/L of $MoO_4^{2-}$, 75 g/L of an acid, 0.7 mL/L of a brightener, 75 mg/L of chloride ion, 0.4 mL/L of a leveling agent, and 0.8 mL/L of an additive. The acid was H2SO4, the brightener was sodium propylene sulfonate, the soluble chloride salt (i.e. the chloride ion) was sodium chloride, and the leveling agent was polyvinyl alcohol. The first reduction potential was 0.3419 V, and the thickness of the metal layer was 4000 A. The second reduction potential was −0.2 V, and the thickness of the barrier layer was 300 A. The temperature for electrochemical deposition was 25° C.

(5) A source-drain electrode was formed on a surface of the active layer as follows:

(a) A conductive layer was formed on the side of the insulating layer away from the substrate by sputtering. The conductive layer was a titanium layer and had a thickness of 400 A.

(b) A metal layer and a barrier layer was formed sequentially on a side of the conductive layer away from the substrate by sputtering. The metal layer was made of copper and had a thickness of 4000 A. The barrier layer was made of titanium and had a thickness of 300 A.

(c) A photoresist layer was coated on a side of the barrier layer away from the substrate.

(d) A side of the photoresist layer away from the barrier layer was exposed using a mask and then developed to form a groove penetrating the photoresist layer, thus obtaining a patterned photoresist layer. The metal layer and the barrier layer were etched by an etching process until the conductive layer was exposed and the photoresist layer was removed, leaving the unetched part of the metal layer and the barrier layer to obtain the conductive layer with the patterned metal layer and the patterned barrier layer, thereby obtaining the source-drain electrode. The etching the metal layer and the barrier layer by the etching process until the conductive layer was exposed was as follows: the photoresist layer with the groove was formed was placed into an etching solution for etching. The etching solution was composed of 5 g/L of nitric acid, 40 g/L of phosphoric acid, and 20 g/L of oxalic acid. The temperature for the etching process was 30° C. The time of the etching process was 85 s.

(6) A protection layer was formed on a surface of the source-drain electrode, thereby obtaining the array substrate. The protection layer was made of silicon nitride and had a thickness of 2500 A.

Example 2

The manufacturing process of the array substrate of this example was substantially the same as that of Example 1, except the forming the data line on the side of the insulating layer away from the substrate for the fact that the electrolyte contains 250 g/L of $Cu^{2+}$, 40 g/L of $Ti^{2+}$, 120 mg/L of chloride ion, 100 g/L of acid, 1 mL/L of brightener, 0.8 mL/L of leveling agent and 1.5 mL/L of additive. The acid was HCl. The brightener was chloride ion. The soluble chloride salt was magnesium chloride. The leveling agent was polyacrylic acid. The metal layer had a thickness of 4000 A. The first reduction potential was −1.5 V, and the thickness of the barrier layer was 300 A. The temperature for electrochemical deposition was 35° C.

Example 3

The manufacturing process of the array substrate of this example was substantially the same as that of Example 1, except, in step (1), that the step of forming the gate layer on the substrate was as follows:

(a) A conductive layer was formed on the substrate by sputtering. The conductive layer was a molybdenum layer and had a thickness of 400 A.

(b) A photoresist layer was coated on a side of the conductive layer away from the substrate. The photoresist layer had a thickness of 2.2 μm.

(c) The photoresist layer was exposed using a mask and then developed to form a groove penetrating the photoresist layer, thus obtaining a patterned photoresist layer.

(d) A functional material on the patterned photoresist layer was deposited electrochemically and then the photoresist layer was stripped off to obtain the conductive layer with a patterned metal layer and a patterned barrier layer which were stacked, thereby obtaining the data line. The step of depositing the functional material electrochemically on the patterned photoresist layer was as follows: the patterned photoresist layer was placed into an electrolyte; the electrolyte was energized under a first reduction potential or a first reduction current such that a first ion was reduced and deposited on the patterned photoresist layer to form a metal material; and the electrolyte was energized at a second reduction potential or a second reduction current such that a second ion was reduced and deposited on the patterned photoresist layer to form a barrier material. The electrochemical deposition was performed in the same electrolyte to continuously electrochemically deposit the metal material and the barrier material. The second reduction potential was −0.0036 V, and the thickness of the barrier layer was 300 A. The temperature for electrochemical deposition was 20° C. The electrolyte was composed of 190 g/L of $Cu^{2+}$, 25 g/L of $MoO_4^{2-}$, 75 g/L of acid, 0.7 mL/L of brightener, 75 mg/L of chloride ion, 0.4 mL/L of leveling agent, and 0.8 mL/L of additive. The acid was H2SO4, the brightener was sodium propylene sulfonate, the soluble chloride salt (i.e. the chloride ion) was sodium chloride, and the leveling agent was polyvinyl alcohol. The first reduction potential was 0.3419 V, and the thickness of the metal layer was 4000 A. The second reduction potential was −0.0036 V, and the thickness of the barrier layer was 300 A. The temperature for electrochemical deposition was 25° C.

Example 4

The manufacturing process of the array substrate of this example was substantially the same as that of Example 1, except, in step (5), that the step of forming a source-drain electrode on the surface of the active layer was as follows:

(a) A conductive layer was formed on the active layer by sputtering. The conductive layer was an aluminum layer and had a thickness of 400 A.

(b) A photoresist layer was coated on a side of the conductive layer away from the substrate. The photoresist layer had a thickness of 2.2 μm.

(c) The photoresist layer was exposed using a mask and then developed to form a groove penetrating the photoresist layer, thus obtaining a patterned photoresist layer.

(d) A functional material was deposited electrochemically on the patterned photoresist layer and then the photoresist layer was stripped off to obtain the conductive layer with a patterned metal layer and a patterned barrier layer which were stacked, thereby obtaining the source-drain electrode. The step of depositing the functional material electrochemically on the patterned photoresist layer was as follows: the patterned photoresist layer was placed into an electrolyte; the electrolyte was energized under a first reduction potential such that a first ion was reduced and deposited on the patterned photoresist layer to form a metal material; and the electrolyte was energized under a second reduction potential such that a second ion was reduced and deposited on the patterned photoresist layer to form a barrier material. The electrochemical deposition was performed in the same electrolyte. The electrolyte was composed of 190 g/L of $Cu^{2+}$, 25 g/L of $MoO_4^{2-}$, 75 g/L of an acid, 0.7 mL/L of a brightener, 75 mg/L of chloride ion, 0.4 mL/L of a leveling agent, and 0.8 mL/L of an additive. The acid was H2SO4, the brightener was sodium propylene sulfonate, the soluble chloride salt (i.e. the chloride ion) was sodium chloride, and the leveling agent was polyvinyl alcohol. The first reduction potential was 0.3419 V, and the thickness of the metal layer was 4000 A. The second reduction potential was −0.2 V, and the thickness of the barrier layer was 300 A. The temperature for electrochemical deposition was 25° C.

Example 5

The manufacturing process of the array substrate of this example was substantially the same as that of Example 1, except, in step (4), that the step of depositing a functional material electrochemically on the patterned photoresist layer was as follows: the photoresist layer with the groove was placed into a first electrolyte for electrochemical deposition under the first reduction potential such that a first ion was reduced and deposited on the patterned photoresist layer to form a metal material. A second ion was added to the first electrolyte for continuing the electrochemical deposition under the second reduction potential when the concentration of the first ion in the first electrolyte was decreased to 5 g/L such that the second ion was reduced and deposited on a metal material to form a barrier material layer. The first electrolyte was composed of 190 g/L of $Cu^{2+}$ (i.e. the first ion), 75 g/L of acid, 0.7 mL/L of brightener, 75 mg/L of chloride ion, 0.4 mL/L of leveling agent, and 0.8 mL/L of additive. The acid was $H_3PO_4$, the brightener was sodium propylene sulfonate, the soluble chloride salt (i.e. the chloride ion) was magnesium chloride, and the leveling agent was polyvinyl alcohol. The second ion was added to the first electrolyte such that the initial concentration of the second ion was 60 g/L, with the second ion being $MoO_4^{2-}$. The temperature for electrochemical deposition was 25° C. The first reduction potential was 0.8 V. The second reduction potential was −0.2V. The metal layer had a thickness of 4000 A. The barrier layer had a thickness of 300 A.

Example 6

The manufacturing process of the array substrate of this example was substantially the same as that of Example 5, except, in the step of depositing a functional material electrochemically on the patterned photoresist layer, that the electrolyte contains 250 g/L of $Cu^{2+}$, 120 mg/L of chloride ion, 100 g/L of acid, 1 mL/L of brightener, 0.8 mL/L of leveling agent and 1.5 mL/L of additive. The acid was HCl. The brightener was chloride ion. The soluble chloride salt was magnesium chloride. The leveling agent was polyacrylic acid. The second ion into the first electrolyte was added when the concentration of the first ion in the first electrolyte was decreased to 0.5 g/L. The second ion was added to the first electrolyte such that the initial concentration of the second ion of 80 g/L, with the second ion being $MoO_4^{2-}$. The temperature for electrochemical deposition was 35° C. The second reduction potential was −1.5 V. The metal layer had a thickness of 4000 A. The barrier layer had a thickness of 300 A.

Example 7

The manufacturing process of the array substrate of this example was substantially the same as that of Example 6, except, in step (1), that the step of forming the gate layer on the substrate was as follows:

(a) A conductive layer was formed on the substrate by sputtering. The conductive layer was a molybdenum layer and had a thickness of 400 A.

(b) A photoresist layer was coated on a side of the conductive layer away from the substrate. The photoresist layer had a thickness of 2.2 μm.

(c) The photoresist layer was exposed using a mask and then developed to form a groove penetrating the photoresist layer, thus obtaining a patterned photoresist layer.

(d) A functional material was deposited electrochemically on the patterned photoresist layer and then the photoresist layer was stripped off to obtain the conductive layer with a patterned metal layer and a patterned barrier layer which were stacked, thereby obtaining the gate layer. The step of depositing a functional material electrochemically on the patterned photoresist layer was as follows: the photoresist layer with the groove was placed into a first electrolyte for electrochemical deposition under the first reduction potential such that a first ion was reduced and deposited on the patterned photoresist layer to form a metal material, and the second ion was added to the first electrolyte for continuing the electrochemical deposition under the second reduction potential when the concentration of the first ion in the first electrolyte was decreased to 2 g/L such that the second ion was reduced and deposited on the metal material to form a barrier material. The first electrolyte was composed of 190 g/L of $Cu^{2+}$ (i.e. the first ion), 75 g/L of acid, 0.7 mL/L of brightener, 75 mg/L of chloride ion, 0.4 mL/L of leveling agent, and 0.8 mL/L of additive. The acid was $H_3PO_4$, the brightener was sodium propylene sulfonate, the soluble chloride salt (i.e. the chloride ion) was magnesium chloride, and the leveling agent was polyvinyl alcohol. The second ion was added to the first electrolyte such that the initial concentration of the second ion was 60 g/L, with the second ion being $MoO_4^{2-}$. The temperature for electrochemical deposition was 25° C. The first reduction potential was 0.8 V. The second reduction potential was −0.5 V. The metal layer had a thickness of 4000 A. The barrier layer had a thickness of 300 A.

Example 8

The manufacturing process of the array substrate of this example was substantially the same as that of Example 7, except, in step (5), that the step of forming a source-drain electrode on the surface of the active layer was as follows:

(a) A conductive layer was formed on the active layer by sputtering. The conductive layer was an aluminum layer and had a thickness of 400 A.

(b) A photoresist layer was coated on a side of the conductive layer away from the substrate. The photoresist layer had a thickness of 2.2 μm.

(c) The photoresist layer was exposed using a mask and then developed to form a groove penetrating the photoresist layer, thus obtaining a patterned photoresist layer.

(d) A functional material was deposited electrochemically on the patterned photoresist layer and then the photoresist layer was stripped off to obtain the conductive layer with a patterned metal layer and a patterned barrier layer which were stacked, thereby obtaining the source-drain electrode. The step of depositing a functional material electrochemically on the patterned photoresist layer was as follows: the photoresist layer with the groove was placed into a first electrolyte for electrochemical deposition under the first reduction potential such that the first ion was reduced and deposited on the patterned photoresist layer to form the metal material, and the second ion was added to the first electrolyte for continuing the electrochemical deposition under the second reduction potential when the concentration of the first ion in the first electrolyte was decreased to 5 g/L such that the second ion was reduced and deposited on the metal material to form a barrier material. The first electrolyte was composed of 190 g/L of $Cu^{2+}$ (i.e. the first ion), 75 g/L of acid, 0.7 mL/L of brightener, 75 mg/L of chloride ion, 0.4 mL/L of leveling agent, and 0.8 mL/L of additive. The acid was $H_3PO_4$, the brightener was sodium propylene sulfonate, the soluble chloride salt (i.e. the chloride ion) was magnesium chloride, and the leveling agent was polyvinyl alcohol. The second ion was added to the first electrolyte such that the initial concentration of the second ion was 60 g/L, with the second ion being $MoO_4^{2-}$. The temperature for electrochemical deposition was 25° C. The first reduction potential was 0.8 V. The second reduction potential was −0.5 V. The metal layer had a thickness of 4000 A. The barrier layer had a thickness of 300 A.

Example 9

The manufacturing process of the array substrate of this example was substantially the same as that of Example 1, except, in step (4), that the step of forming the data line on the side of the insulating layer away from the substrate comprises: a metal layer and a barrier layer were formed sequentially on the side of the conductive layer away from the substrate by sputtering. A photoresist layer was coated on the side of the barrier layer away from the substrate. A side of the photoresist layer away from the barrier layer was exposed using a mask and then developed to form a groove penetrating the photoresist layer, thus obtaining the patterned photoresist layer. The metal layer and the barrier layer was etched by an etching process until the conductive layer was exposed and removing the photoresist layer, leaving the unetched part of the metal layer and the barrier layer to form a patterned functional material layer, thereby obtaining the data line. The step of etching the metal layer and the barrier layer by the etching process until the conductive layer was exposed was as follows: the photoresist layer with the groove was placed into an etching solution for etching. The etching solution was composed of 5 g/L of nitric acid, 40 g/L of phosphoric acid, and 20 g/L of oxalic acid. The temperature for the etching process was 30° C. The time of the etching process was 80 s.

Example 10

The manufacturing process of the array substrate of this example was substantially the same as that of Example 1, except, in step (4), that the step of forming the data line on the side of the insulating layer away from the substrate comprises: in the step of depositing sequentially and electrochemically the metal layer and the barrier layer on the patterned photoresist layer, the photoresist layer with the groove was placed in a first electrolytic bath containing an electrolyte, performing a first electrochemical deposition under the first reduction potential to depositing the metal material in the groove, obtaining a metal material layer; the substrate was taken out and placed in a second electrolytic bath containing the same electrolyte, performing a second electrochemical deposition under the second reduction potential to depositing the barrier material in the groove, obtaining a barrier material layer.

Test:

Each of the gate layers, the data lines, and the source-drain electrodes of Examples 1 to 10 was measured for the conductivity, and each of the array substrates of Examples 1 to 10 was measured for the charging time. Each of the array substrates of Examples 1 to 10 were assembled into a liquid crystal display panel, which was measured for the refresh rate. The measurement results are shown in Table 1. Table 1 shows the conductivity of the gate layers, the data lines and the source-drain electrodes of Examples 1 to 10, the charging time of the array substrates, and the refresh rate of the liquid crystal display panels containing the array substrates of Examples 1-10, respectively. Among them, the conductivity was measured by a four-probe method or device; and the refresh rate was measured using an oscilloscope.

TABLE 1

|  | Conductivity ($10^6$ S/M) | | | Liquid Crystal | |
|---|---|---|---|---|---|
|  | gate layer | Data line | Source-drain Electrode | Array Substrate Charging Time (Ms) | Display Panel Refresh Rate (Hz) |
| Example 1 | 4.5 | 2.8 | 4.2 | 11.2 | 60 |
| Example 2 | 4.0 | 2.5 | 3.7 | 11.8 | 60 |
| Example 3 | 4.8 | 3.0 | 4.2 | 10.9 | 60 |
| Example 4 | 4.8 | 3.0 | 5.2 | 10.5 | 60 |
| Example 5 | 4.9 | 3.0 | 5.0 | 11.3 | 60 |
| Example 6 | 4.4 | 2.8 | 4.3 | 11.6 | 60 |
| Example 7 | 5.5 | 3.4 | 4.3 | 11.0 | 60 |
| Example 8 | 5.5 | 3.4 | 5.8 | 10.6 | 60 |
| Example 9 | 4.5 | 2.2 | 4.2 | 11.7 | 60 |
| Example 10 | 4.5 | 2.3 | 4.2 | 11.5 | 60 |

As can be seen from Table 1, the conductivity of the data lines obtained in Examples 1 to 8 and Example 10 were between $2.3 \times 10^6$ S/m and $3.4 \times 10^6$ S/m, higher than that of Example 9; and the charging time of the array substrates obtained in Examples 1 to 8 and Example 10 was between 10 μs and 12 μs, indicating that the gate unit manufactured by electrochemical deposition in the above-mentioned embodiment had higher conductivity and can shorten the charging time for the pixels in the array substrate. In addition, the refresh rate of the liquid crystal display panel containing the array substrates of Examples 1 to 8 and Example 10, respectively, was 60 Hz, indicating that the array substrate obtained by the manufacturing method of the foregoing embodiment can be used to manufacture a liquid crystal display panel with a higher refresh rate. In summary, the manufacturing method in the above embodiment can be used to manufacture an array substrate with a shorter charging time.

The technical features of the above-mentioned embodiments can be combined arbitrarily, while all possible combinations of the various technical features in the above-mentioned embodiments are not described in order to make the description concise. However, it should be regarded as the scope of this specification as long as there is no contradiction in the combination of these technical features.

The above-mentioned embodiments only express several implementation modes of the present invention, which are described in a more specific and detailed manner, but should not be understood as a limitation on the scope of the present disclosure. It should be pointed out that for those of ordinary skill in the art, several modifications and improvements can be made without departing from the concept of the present invention, and these all fall within the protection scope of the present disclosure. Therefore, the protection scope of the present disclosure should be subject to the appended claims.

What is claimed is:

1. A method for manufacturing a data line, comprising:
    forming a conductive layer on a substrate;
    forming a photoresist layer on a side of the conductive layer away from the substrate;
    exposing and then developing the photoresist layer to form a groove penetrating the photoresist layer, thus obtaining a patterned photoresist layer; and
    depositing a functional material electrochemically on the patterned photoresist layer, then removing the patterned photoresist layer to obtain the conductive layer with a patterned functional material layer, thereby obtaining the data line,
    wherein the depositing the functional material electrochemically on the patterned photoresist layer comprises:
    placing the patterned photoresist layer into a first electrolyte containing a first ion;
    energizing the first electrolyte under a first reduction potential or a first reduction current, such that the first ion is reduced and deposited on the patterned photoresist layer to form a metal material;
    adding a second ion into the first electrolyte; and
    performing a second electrochemical deposition under a second reduction potential or a second reduction current, such that the second ion is reduced and deposited on the metal material to form a barrier material.

2. The method according to claim 1, wherein the first ion is $Cu^{2+}$, the first reduction potential is 0.34 V to 0.8 V, and the density of the first reduction current is 1.5 A/dm$^2$ to 8 A/dm$^2$.

3. The method according to claim 1, wherein the second ion is $MoO_4^{2-}$, the second reduction potential is -0.3 V to 0.1 V, and the density of the second reduction current is 0.5 A/dm$^2$ to 1.2 A/dm$^2$.

4. The method according to claim 1, wherein the second ion is $Ti^{2+}$, the second reduction potential is -1.2 V to -1.7 V, and the density of the second reduction current is 5 A/dm$^2$ to 50 A/dm$^2$.

* * * * *